United States Patent
Kim et al.

(10) Patent No.: US 10,579,131 B2
(45) Date of Patent: Mar. 3, 2020

(54) APPARATUS AND METHOD FOR APPLYING SUITABLE VOLTAGE TO A COMPONENT OF A SYSTEM-ON-CHIP

(71) Applicant: Samsung Electronics Co., Ltd., Suwon-si (KR)

(72) Inventors: Jaecheol Kim, Daegu (KR); Jinkyu Kim, Daegu (KR); Dongwoo Kim, Seoul (KR); Jeongho Kim, Yongin-si (KR); Jaesoo Chaung, Suwon-si (KR); Jongshik Ha, Gyeongsangbuk-do (KR); Heetae Oh, Seongnam-si (KR); Hyeokseon Yu, Daegu (KR); Seungyoung Lee, Gumi-si (KR); Wooyoung Choi, Seoul (KR); Jaewoong Han, Gumi-si (KR); Mangun Hur, Daegu (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 146 days.

(21) Appl. No.: 15/814,790

(22) Filed: Nov. 16, 2017

(65) Prior Publication Data
US 2018/0136713 A1    May 17, 2018

(30) Foreign Application Priority Data
Nov. 16, 2016  (KR) .......................... 10-2016-0152583

(51) Int. Cl.
*G06F 1/26* (2006.01)
*G06F 1/32* (2019.01)
(Continued)

(52) U.S. Cl.
CPC .......... *G06F 1/3296* (2013.01); *G06F 1/3206* (2013.01); *G06F 15/7807* (2013.01); *H03F 3/2173* (2013.01); *Y02D 10/172* (2018.01)

(58) Field of Classification Search
None
See application file for complete search history.

(56) References Cited

U.S. PATENT DOCUMENTS 9,335,803 B2    5/2016  Wang et al.
9,652,021 B2    5/2017  Kim
(Continued)

FOREIGN PATENT DOCUMENTS

KR  10-2015-0022593 A   3/2015
KR     10-1593952 B1     2/2016

OTHER PUBLICATIONS

International Search Report for PCT Patent Application No. PCT/KR2017/013022 dated Apr. 2, 2018; 3 pages.
(Continued)

*Primary Examiner* — Nitin C Patel (57) ABSTRACT

An electronic device includes a system-on-chip (SoC) including at least one component, a memory, and a processor functionally connected to the SoC and the memory. The processor is configured to apply a default voltage for driving the at least one component at a specific frequency. The processor is also configured to determine whether data on an offset voltage corresponding to the at least one component and the specific frequency is stored. The processor is further configured to apply the offset voltage, being different from the default voltage, to the at least one component when the data on the offset voltage is stored. Other embodiments are possible.

20 Claims, 7 Drawing Sheets

(51) Int. Cl.
  *G06F 1/3296* (2019.01)
  *G06F 1/3206* (2019.01)
  *G06F 15/78* (2006.01)
  *H03F 3/217* (2006.01)

(56) References Cited

U.S. PATENT DOCUMENTS

| | | | |
|---|---|---|---|
| 2008/0282102 A1 | 11/2008 | Reddy et al. | |
| 2008/0307240 A1* | 12/2008 | Dahan | G06F 1/06 |
| | | | 713/320 |
| 2009/0049314 A1 | 2/2009 | Taha et al. | |
| 2009/0138737 A1* | 5/2009 | Kim | G06F 1/32 |
| | | | 713/322 |
| 2009/0289615 A1 | 11/2009 | Foley | |
| 2011/0314306 A1* | 12/2011 | Lin | G06F 1/3203 |
| | | | 713/300 |
| 2013/0254569 A1 | 9/2013 | Kozaczuk | |
| 2013/0262894 A1* | 10/2013 | Lee | G06F 1/324 |
| | | | 713/322 |
| 2013/0311799 A1 | 11/2013 | Fitzpatrick et al. | |
| 2014/0068285 A1* | 3/2014 | Lee | G06F 1/324 |
| | | | 713/300 |
| 2014/0091624 A1 | 4/2014 | Park et al. | |
| 2014/0149750 A1 | 5/2014 | Brock et al. | |
| 2014/0184619 A1* | 7/2014 | Kim | G06T 1/20 |
| | | | 345/519 |
| 2014/0312951 A1 | 10/2014 | Moore et al. | |
| 2015/0006915 A1* | 1/2015 | Ganesan | G06F 1/26 |
| | | | 713/300 |
| 2015/0192942 A1* | 7/2015 | Smith | G05F 1/465 |
| | | | 327/540 |
| 2017/0357298 A1* | 12/2017 | Hovis | G06F 1/324 |

OTHER PUBLICATIONS

Supplementary European Search Report dated Oct. 15, 2019 in connection with European Patent Application No. 17 87 2386, 6 pages.

* cited by examiner

APPARATUS AND METHOD FOR APPLYING SUITABLE VOLTAGE TO A COMPONENT OF A SYSTEM-ON-CHIP

CROSS-REFERENCE TO RELATED APPLICATION AND CLAIM OF PRIORITY

The present application is related to and claims priority to Korean Patent Application No. 10-2016-0152583 filed on Nov. 16, 2016, the contents of which are incorporated herein by reference.

TECHNICAL FIELD

Embodiments of the present invention relate to a system-on-chip, an electronic device including the system-on-chip, and a method for driving the electronic device.

BACKGROUND

As the performance of an electronic device (e.g., a mobile device, a smart phone, etc.) is dramatically developed, the data processing speed of the electronic device is also becoming faster. However, an increase of the data processing speed may often cause an increase of power consumption in the electronic device. Therefore, an efficient management of power consumption is becoming a major issue in the electronic device.

A system-on-chip ("SoC", also simply referred to as a "chip" hereinafter) is one of modules mounted in the electronic device. Recently, in order to reduce power consumption by varying the voltage and operating frequency applied to the chip according to the operating environment of the electronic device, a dynamic voltage and frequency scaling (DVFS) technology is applied to the SoC.

In order to improve the manufacturing yield, the modules such as the SoC may use an adaptive supply voltage (ASV) technique for controlling a supply voltage to the chip by measuring an actual operating speed and power consumption in the chip. A vendor which manufactures the chip may allow the chip to have a margin of operating at a voltage lower than the voltage defined in the specification so as to ensure the operating speed of the chip belonging to the same ASV group. However, when the chip is actually applied to the electronic device, the margin may be often different from that measured when the chip is manufactured, due to an inherent voltage drop of a board itself (also referred to as a board IR drop) and a power management integrated circuit (PMIC) variation. Because of this difference, the chip mounted in the electronic device may have a large voltage margin, which may inhibit an efficient power management in the electronic device. Or, due to such a difference, the chip mounted in the electronic device may have an insufficient voltage margin, which may cause defects in the manufacturing process of the electronic device.

SUMMARY

To address the above-discussed deficiencies, it is a primary object to provide an electronic device that may apply a suitable voltage to a chip, based on a voltage applied to the electronic device and a voltage characteristic depending on board characteristics of the electronic device.

According to various embodiments of the present disclosure, an electronic device may comprise a system-on-chip (SoC) including at least one component, a memory, and a processor functionally connected to the SoC and the memory. The processor may be configured to apply a default voltage for driving the at least one component at a specific frequency, to determine whether data on an offset voltage corresponding to the at least one component and the specific frequency is stored, and to apply the offset voltage, being different from the default voltage, to the at least one component when the data on the offset voltage is stored.

According to various embodiments of the present disclosure, a method for driving an electronic device, in which a system-on-chip (SoC) including at least one component is mounted, may comprise operations of applying a default voltage for driving the at least one component at a specific frequency, determining whether data on an offset voltage corresponding to the at least one component and the specific frequency is stored, and applying the offset voltage, being different from the default voltage, to the at least one component when the data on the offset voltage is stored.

According to various embodiments of the present disclosure, in an electronic device in which mounted modules (e.g., SoC) have the same ASV group, it is possible to determine a voltage applied to the electronic device and a voltage characteristic (e.g., recognized as a voltage higher or lower than an actually applied voltage) depending on board characteristics in an actual operation. Based on such determination, the electronic device may apply a suitable voltage to the chip for each board. Thus, the electronic device may reduce the power consumption thereof and also obviate the occurrence of defects in the manufacturing process thereof.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 7, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged electronic device.

Hereinafter, embodiments of the present disclosure are described in detail with reference to the accompanying drawings. While the present disclosure may be embodied in many different forms, specific embodiments of the present disclosure are shown in drawings and are described herein in detail, with the understanding that the present disclosure is to be considered to be limited thereto. The same reference numerals are used throughout the drawings to refer to the same or like parts.

An expression "comprising" or "may comprise" used in the present disclosure indicates presence of a corresponding function, operation, or element and does not limit an additional at least one function, operation, or element. The term "comprise" or "have" used herein indicates presence of a characteristic, numeral, step, operation, element, component, or combination thereof described in the Specification and does not exclude presence or addition of at least one other characteristic, numeral, step, operation, element, component, or combination thereof.

In the present disclosure, the term "or" includes any combination or the entire combination of together listed words. For example, "A or B" may include A, B, or A and B.

Expressions such as "a first" and "a second" in the present disclosure may represent various elements of the present disclosure, but do not limit corresponding elements, e.g., do not limit order and/or importance of corresponding elements, but may be used for distinguishing one element from another element. For example, both a first user device and a second user device are user devices and represent different user devices. For example, a first constituent element may be referred to as a second constituent element without deviating from the scope of the present disclosure, and similarly, a second constituent element may be referred to as a first constituent element.

When it is described that a first element is "coupled" to another element, such as a second element, the first element may be "directly coupled" to the second element or "electrically coupled" to the second element through a third element. However, when it is described that a first element is "directly coupled" to a second element, no third element may exist between the first and second elements.

Terms used in the present disclosure are not intended to limit the present disclosure but to illustrate embodiments of the present disclosure. When using in a description of the present disclosure and the appended claims, a singular form includes a plurality of forms unless it is explicitly differently represented.

Unless differently defined, terms including a technical term and a scientific term used herein have the same meaning as may be generally understood by a person of common skill in the art. It should be understood that generally using terms defined in a dictionary have a meaning corresponding to that of a context of related technology and are not understood to have an ideal or excessively formal meaning unless explicitly defined.

In this disclosure, an electronic device may have a communication function. For example, an electronic device may be a smart phone, a tablet PC, a mobile phone, a video phone, an e-book reader, a desktop PC, a laptop PC, a netbook computer, a PDA (personal digital assistant), a PMP (portable multimedia player), an MP3 player, a portable medical device, a digital camera, or a wearable device, such as an HMD (head-mounted device) in the form of electronic glasses, electronic clothes, an electronic bracelet, an electronic necklace, an electronic accessory, or a smart watch.

According to some embodiments, an electronic device may be a smart home appliance that involves a communication function, such as a TV (television), a DVD (digital video disk) player, audio equipment, a refrigerator, an air conditioner, a vacuum cleaner, an oven, a microwave, a washing machine, an air cleaner, a set-top box, a TV box, such as Samsung HomeSync™, Apple TV™, and Google TV™, a game console, an electronic dictionary, an electronic key, a camcorder, or an electronic picture frame.

According to some embodiments, an electronic device may be a medical device, such as MRA (magnetic resonance angiography), MRI (magnetic resonance imaging), CT (computed tomography), and ultrasonography, a navigation device, a GPS (global positioning system) receiver, an EDR (event data recorder), an FDR (flight data recorder), a car infotainment device, electronic equipment for ship, such as a marine navigation system or a gyrocompass), avionics, security equipment, or an industrial or home robot.

According to some embodiments, an electronic device may be furniture or part of a building or construction having a communication function, an electronic board, an electronic signature receiving device, a projector, or various measuring instruments, such as a water, electric, gas, or a wave meter. An electronic device disclosed herein may be one of the above-mentioned devices or any combination thereof. As well understood by those skilled in the art, the above-mentioned electronic devices are not to be considered as a limitation of the present disclosure.

According to embodiments, the electronic device may control the activation of a second sensor, based on a signal received through a first sensor, which reduces power consumption of the electronic device compared to a conventional device, in which the second sensor is always activated. The electronic device according to embodiments of the present disclosure may perform a predefined function in response to the signal received through the second sensor.

Figure 1:
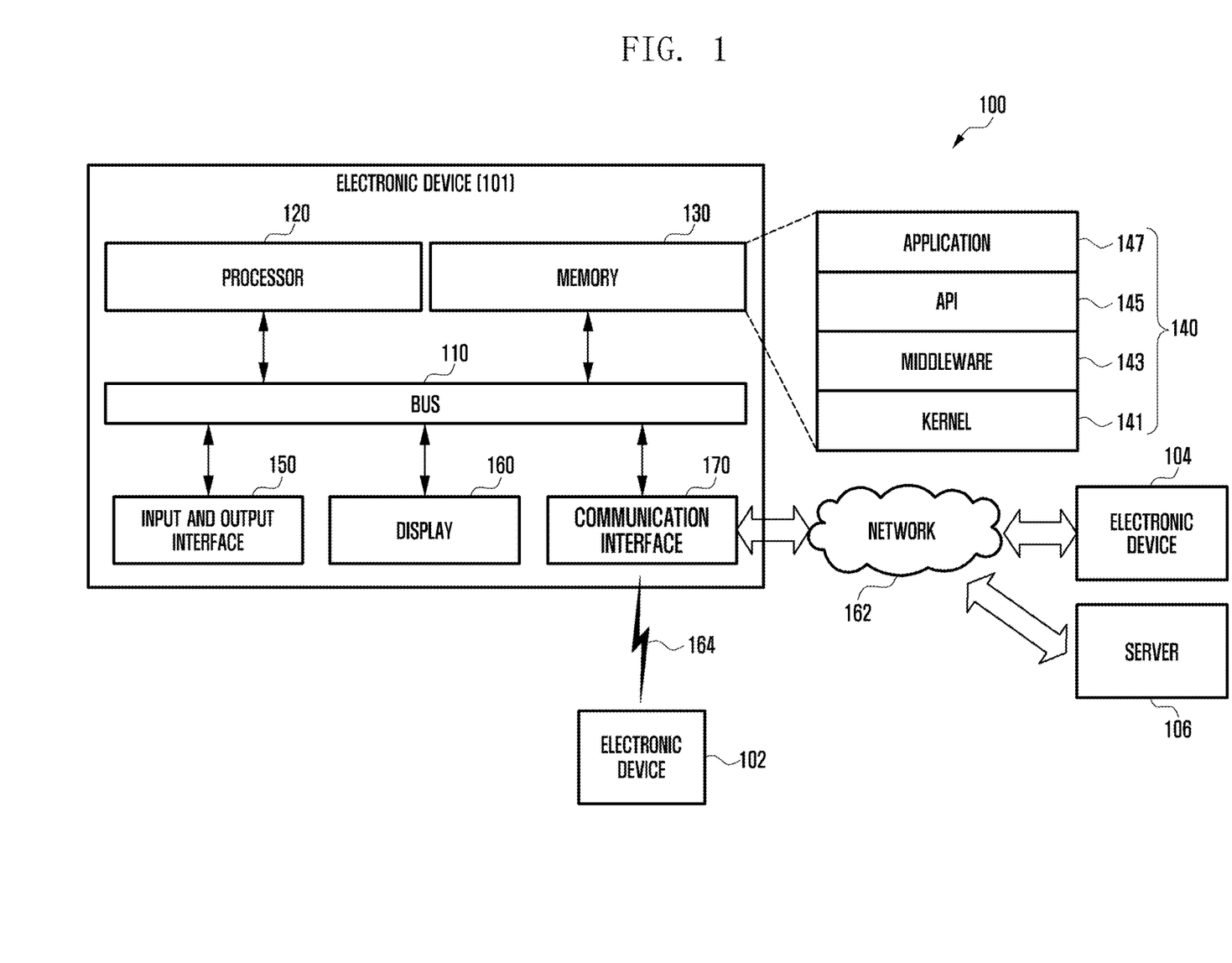
FIG. 1 illustrates a diagram of a network environment including an electronic device, according to various embodiments of the present disclosure.

FIG. 1 illustrates a block diagram 100 of a network environment including an electronic device 101, according to an embodiment of the present disclosure.

Referring to FIG. 1, the electronic device 101 may include a bus 110, a processor 120, a memory 130, an input/output interface (i.e., user input module) 150, a display 160, and a communication interface 170.

The bus 110 may be a circuit for interconnecting elements of the electronic device 101 and for allowing a communication, such as by transferring a control message, between the elements.

The processor 120 can receive commands from the memory 130, the input/output interface 150, the display 160, and the communication interface 170, through the bus 110, can decipher the received commands, and perform operations and/or data processing according to the deciphered commands.

The memory 130 can store commands received from the processor 120 and/or other elements, and/or commands and/or data generated by the processor 120 and/or other elements. The memory 130 may include software and/or programs 140, such as a kernel 141, middleware 143, an application programming interface (API) 145, and an application 147. Each of the programming modules described above may be configured by software, firmware, hardware, and/or combinations of at least two thereof.

The kernel 141 can control and/or manage system resources used for execution of operations and/or functions implemented in other programming modules, such as the middleware 143, the API 145, and/or the applications 147, and can provide an interface through which the middleware 143, the API 145, and/or the applications 147 can access and then control and/or manage an individual element of the electronic device 101.

The middleware 143 can perform a relay function which allows the API 145 and/or the applications 147 to communicate with and exchange data with the kernel 141. In relation to operation requests received from at least one of applications 147, the middleware 143 can perform load balancing in relation to the operation requests by giving a priority in using a system resource, e.g. the bus 110, the processor 120, and/or the memory 130, of the electronic device 101 to at least one application from among the at least one of the applications 147.

The API 145 is an interface through which the applications 147 can control a function provided by the kernel 141 and/or the middleware 143, and may include at least one interface or function for file control, window control, image processing, and/or character control.

The input/output interface 150 can receive a command and/or data from a user, and transfer the received command and/or data to the processor 120 and/or the memory 130 through the bus 110. The display 160 can display an image, a video, and/or data to a user.

The communication interface 170 can establish a communication between the electronic device 101 and another electronic devices 102 and 104 and/or a server 164, and can support short range communication protocols, e.g. a wireless fidelity (WiFi) protocol, a BlueTooth (BT) protocol, and a near field communication (NFC) protocol, communication networks, e.g. Internet, local area network (LAN), wide area network (WAN), a telecommunication network, a cellular network, and a satellite network, a plain old telephone service (POTS), or any other similar and/or suitable communication networks, such as network 162. Each of the electronic devices 102 and 104 may be the same type or different types of electronic devices.

Figure 2:
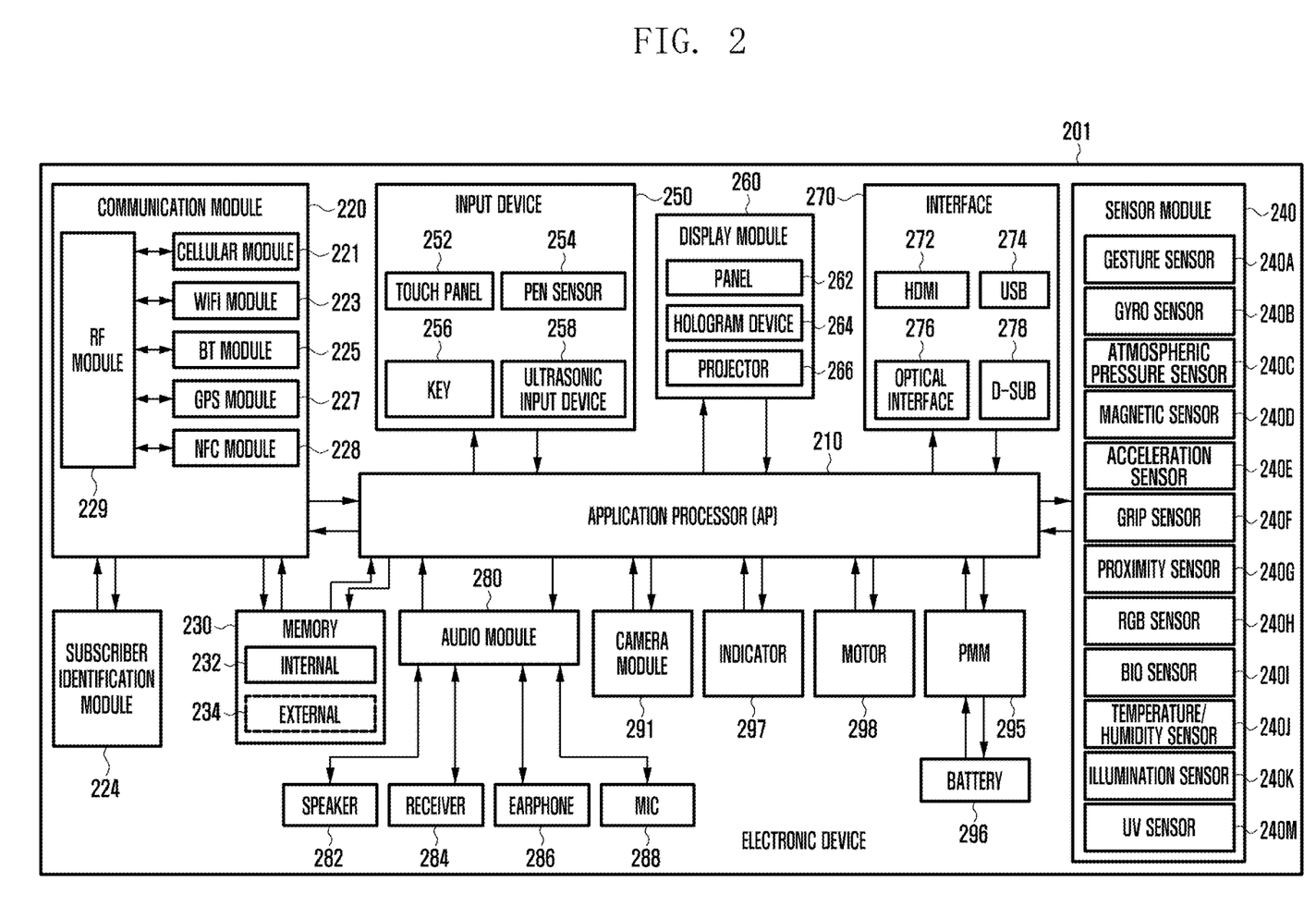
FIG. 2 illustrates a block diagram of an electronic device, according to various embodiments of the present disclosure.

FIG. 2 illustrates a block diagram of an electronic device 201 in accordance with an embodiment of the present disclosure. The electronic device 201 may form all or part of the electronic device 101 shown in FIG. 1.

Referring to FIG. 2, the electronic device 201 may include at least one application processor (AP) 210, a communication module 220, a subscriber identification module (SIM) card 224, a memory 230, a sensor module 240, an input unit 250, a display 260, an interface 270, an audio module 280, a camera module 291, a power management module 295, a battery 296, an indicator 297, and a motor 298.

The AP 210 may drive an operating system or applications, control a plurality of hardware or software components connected thereto, and also perform processing and operation for various data including multimedia data. The AP 210 may be formed of a system-on-chip (SoC), and may further include a graphic processing unit (GPU).

The communication module 220 may perform a data communication with any other electronic device connected to the electronic device 201 through the network. According to an embodiment, the communication module 220 may include therein a cellular module 221, a WiFi module 223, a BT module 225, a GPS module 227, an NFC module 228, and an RF (radio frequency) module 229.

The cellular module 221 may offer a voice call, a video call, a message service, or an Internet service through a communication network, such as long term evolution (LTE), LTE-advanced (LTE-A), code division multiple access (CDMA), wideband CDMA (WCDMA), universal mobile telecommunications system (UMTS), WiBro, or global system for mobile communication (GSM). Additionally, the cellular module 221 may perform identification and authentication of the electronic device in the communication network, using the SIM card 224. According to an embodiment, the cellular module 221 may perform at least part of functions the AP 210 can provide, such as a multimedia control function.

According to an embodiment, the cellular module 221 may include a communication processor (CP), and may be formed of a SoC, for example. Although some elements such as the cellular module 221, such as the CP, the memory 230, or the power management module 295 are shown as separate elements being different from the AP 210 in FIG. 2, the AP 210 may be formed to have at least part of the above elements in an embodiment of the present disclosure.

According to an embodiment, the AP 210 or the cellular module 221 may load commands or data, received from a nonvolatile memory connected thereto or from at least one of the other elements, into a volatile memory to process them. Additionally, the AP 210 or the cellular module 221 may store data, received from or created at one or more of the other elements, in the nonvolatile memory.

Each of the WiFi module 223, the BT module 225, the GPS module 227 and the NFC module 228 may include a processor for processing data transmitted or received there through. Although FIG. 2 illustrates the cellular module 221, the WiFi module 223, the BT module 225, the GPS module 227 and the NFC module 228 as different blocks, at least two of these modules may be contained in a single IC (integrated circuit) chip or a single IC package, i.e., may be formed as a single SoC.

The RF module 229 may transmit and receive RF signals or any other electric signals, and may include a transceiver, a PAM (power amp module), a frequency filter, or an LNA (low noise amplifier). The RF module 229 may further include any component, e.g., a wire or a conductor, for transmission of electromagnetic waves in a free air space. Although FIG. 2 illustrates that the cellular module 221, the WiFi module 223, the BT module 225, the GPS module 227 and the NFC module 228 share the RF module 229, at least one of these modules may perform transmission and reception of RF signals through a separate RF module in an embodiment of the present disclosure.

The SIM card 224 may be a specific card formed of SIM and may be inserted into a slot formed at a certain location of the electronic device. The SIM card 224 may contain therein an ICCID (integrated circuit card identifier) or an IMSI (international mobile subscriber identity).

The memory 230 may include an internal memory 232 and an external memory 234. The internal memory 232 may include at least one of a volatile memory, such as DRAM (dynamic random access memory), SRAM (static RAM), SDRAM (synchronous DRAM), or a nonvolatile memory, such as OTPROM (one time programmable read-only memory), PROM (programmable ROM), EPROM (erasable and programmable ROM), EEPROM (electrically erasable and programmable ROM), mask ROM, flash ROM, NAND flash memory, and NOR flash memory.

According to an embodiment, the internal memory 232 may have the form of an SSD (solid state drive). The external memory 234 may include a flash drive, e.g., CF (compact flash), SD (secure digital), Micro-SD (micro secure digital), Mini-SD (mini secure digital), xD (extreme digital), or memory stick, and may be functionally connected to the electronic device 201 through various interfaces. The electronic device 201 may further include a storage device or medium such as a hard drive.

The sensor module 240 may measure physical quantity or sense an operating status of the electronic device 201, and then convert measured or sensed information into electric signals. The sensor module 240 may include at least one of a gesture sensor 240A, a gyro sensor 240B, an atmospheric pressure sensor 240C, a magnetic sensor 240D, an acceleration sensor 240E, a grip sensor 240F, a proximity sensor 240G, a color sensor 240H, such as an RGB (red, green, blue) sensor, a biometric sensor 240I, a temperature-humidity sensor 240J, an illumination sensor 240K, and a UV (ultraviolet) sensor 240M. Additionally or alternatively, the sensor module 240 may include an E-nose sensor, an EMG (electromyography) sensor, an EEG (electroencephalogram) sensor, an ECG (electrocardiogram) sensor, an IR (infrared) sensor, an iris scan sensor, or a finger scan sensor. The sensor module 240 may include a control circuit for controlling one or more sensors equipped therein.

The input unit 250 may include a touch panel 252, a digital pen sensor 254, a key 256, or an ultrasonic input device 258. The touch panel 252 may recognize a touch input in a capacitive, resistive, infrared, or ultrasonic type manner. The touch panel 252 may further include a control circuit. In case of a capacitive type, a physical contact or proximity may be recognized. The touch panel 252 may further include a tactile layer that offers a tactile feedback to a user.

The digital pen sensor 254 may be formed in the same or similar manner as receiving a touch input or by using a separate recognition sheet. The key 256 may include a physical button, an optical key, or a keypad. The ultrasonic input device 258 is capable of identifying data by sensing sound waves with a microphone (MIC) 288 in the electronic device 201 through an input tool that generates ultrasonic signals, thus allowing wireless recognition. According to an embodiment, the electronic device 201 may receive a user input from any external device connected thereto through the communication module 220.

The display 260 may include a panel 262, a hologram device 264, or a projector 266. The panel 262 may be LCD (liquid crystal display), or AM-OLED (active matrix organic light emitting diode) may have a flexible, transparent or wearable form, and may be formed of a single module with the touch panel 252. The hologram device 264 may project a stereoscopic image in the air using interference of light. The projector 266 may project an image onto a screen, which may be located at the inside or outside of the electronic device 201. According to an embodiment, the display 260 may further include a control circuit for controlling the panel 262, the hologram device 264, and the projector 266.

The interface 270 may include an HDMI (high-definition multimedia interface) 272, a USB (universal serial bus) 274, an optical interface 276, and a D-sub (d-subminiature) 278, and may be contained in the communication interface 170 shown in FIG. 1. Additionally or alternatively, the interface 270 may include an MHL (mobile high-definition link) interface, an SD (secure digital) card/MMC (multi-media card) interface, or an IrDA (infrared data association) interface.

The audio module 280 may perform a conversion between sounds and electric signals. At least part of the audio module 280 may be contained in the input/output interface 150 shown in FIG. 1. The audio module 280 may process sound information inputted or outputted through a speaker 282, a receiver 284, an earphone 286, or the MIC 288.

The camera module 291 is capable of obtaining still images and moving images, and may include at least one image sensor, such as a front sensor or a rear sensor, a lens, an ISP (image signal processor, or a flash, such as LED or xenon lamp.

The power management module 295 may manage electric power of the electronic device 201 and may include a PMIC (power management integrated circuit), a charger IC, or a battery gauge.

The PMIC may be formed of an IC chip or SoC. Charging may be performed in a wired or wireless manner. The charger IC may charge a battery 296 and prevent overvoltage or overcurrent from a charger. According to an embodiment, the charger IC may have a charger IC used for at least one of wired and wireless charging types. A wireless charging type may include a magnetic resonance type, a magnetic induction type, or an electromagnetic type. Any additional circuit for a wireless charging may be further used, such as a coil loop, a resonance circuit, or a rectifier.

The battery gauge may measure the residual amount of the battery 296 and a voltage, current or temperature in a charging process. The battery 296 may store or create electric power therein and supply electric power to the electronic device 201. The battery 296 may be a rechargeable or solar battery.

The indicator 297 may illustrate thereon a current status, such as a booting, message, or recharging status of part or all of the electronic device 201. The motor 298 may convert an electric signal into a mechanical vibration. The electronic device 201 may include a specific processor, such as GPU, for supporting a mobile TV. This processor may process media data that comply with standards of DMB (digital multimedia broadcasting), DVB (digital video broadcasting), or media flow.

Each of the above-discussed elements of the electronic device disclosed herein may be formed of one or more components, and may have various names according to the type of the electronic device. The electronic device disclosed herein may be formed of at least one of the above-discussed elements without some elements or with additional elements. Some of the elements may be integrated into a single entity that still performs the same functions as those of such elements before integrated.

Figure 3:
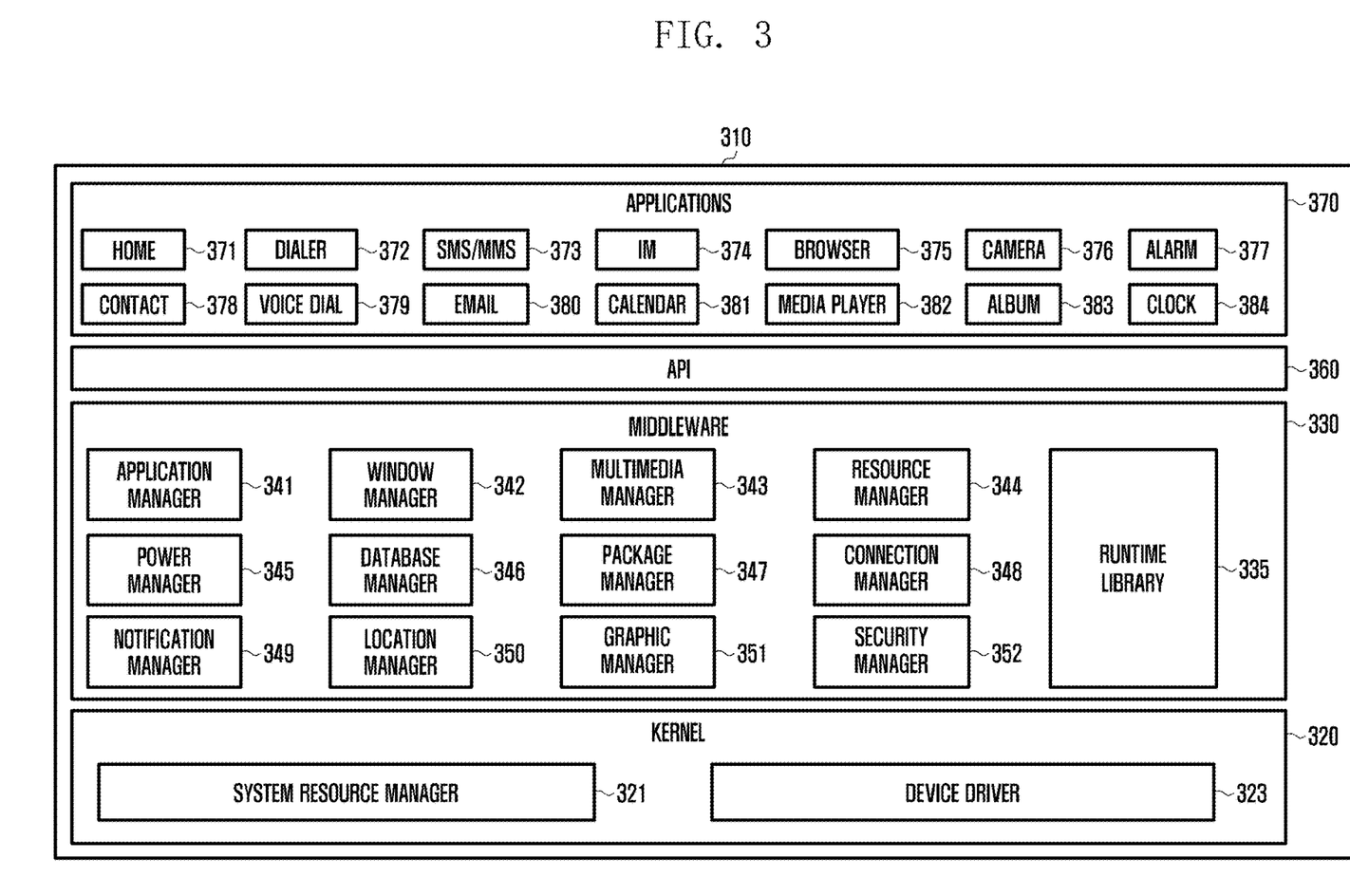
FIG. 3 illustrates a block diagram of a configuration of a programming module, according to various embodiments of the present disclosure.

FIG. 3 illustrates a block diagram of a configuration of a programming module 310 according to an embodiment of the present disclosure.

The programming module 310 may be stored in the electronic device 101 or may be stored in the electronic device 201 illustrated in FIG. 2. At least a part of the programming module 310 may be implemented in software, firmware, hardware, or a combination of two or more thereof. The programming module 310 may be implemented in hardware 201, and may include an OS controlling resources related to an electronic device and/or various applications 370 executed in the OS. For example, the OS may be Android™, iOS™, Windows™, Symbian™, Tizen™, or Bada™.

Referring to FIG. 3, the programming module 310 may include a kernel 320, middleware 330, an API 360, and/or applications 370.

The kernel 320 may include a system resource manager 321 and/or a device driver 323. The system resource manager 321 may include a process manager, a memory manager, and a file system manager. The system resource manager 321 may perform the control, allocation, or recovery of system resources. The device driver 323 may include a display driver, a camera driver, a Bluetooth driver, a shared memory driver, a USB driver, a keypad driver, a Wi-Fi driver, and/or an audio driver, and may further include an inter-process communication (IPC) driver.

The middleware 330 may include multiple modules previously implemented so as to provide a function used in common by the applications 370, and may provide a function to the applications 370 through the API 360 in order to enable the applications 370 to efficiently use limited system resources within the electronic device. For example, as illustrated in FIG. 3, the middleware 330 may include at least one of a runtime library 335, an application manager 341, a window manager 342, a multimedia manager 343, a resource manager 344, a power manager 345, a database manager 346, a package manager 347, a connectivity manager 348, a notification manager 349, a location manager 350, a graphic manager 351, a security manager 352, and any other suitable and/or similar manager.

The runtime library 335 may include a library module used by a complier, in order to add a new function by using a programming language during the execution of the applications 370, and may perform functions which are related to input and output, the management of a memory, or an arithmetic function.

The application manager 341 may manage a life cycle of at least one of the applications 370. The window manager 342 may manage GUI resources used on the screen. The multimedia manager 343 may detect a format used to reproduce various media files and may encode or decode a media file through a codec appropriate for the relevant format. The resource manager 344 may manage resources, such as a source code, a memory, or a storage space, of at least one of the applications 370.

The power manager 345 may operate together with a basic input/output system (BIOS), may manage a battery or power, and may provide power information used for an operation. The database manager 346 may manage a database in such a manner as to enable the generation, search and/or change of the database to be used by at least one of the applications 370. The package manager 347 may manage the installation and/or update of an application distributed in the form of a package file.

The connectivity manager 348 may manage a wireless connectivity such as Wi-Fi and Bluetooth. The notification manager 349 may display or report, to the user, an event such as an arrival message, an appointment, or a proximity alarm, in such a manner as not to disturb the user. The location manager 350 may manage location information of the electronic device. The graphics manager 351 may manage graphic effects, which are to be provided to the user, and/or a user interface related to the graphic effects. The security manager 352 may provide various security functions used for system security and user authentication. According to an embodiment of the present disclosure, when the electronic device has a telephone function, the middleware 330 may further include a telephony manager for managing a voice and/or video telephony call function of the electronic device.

The middleware 330 may generate and use new middleware module through various functional combinations of the above-described internal element modules, may provide modules specialized according to types of OSs in order to provide differentiated functions, and may dynamically delete some of the existing elements, or may add new elements. Accordingly, the middleware 330 may omit some of the elements described in the embodiments of the present disclosure, may further include other elements, or may replace the some of the elements with elements, each of which performing a similar function and having a different name.

The API 360 is a set of API programming functions, and may be provided with a different configuration according to an OS. In the case of Android or iOS, for example, one API set may be provided to each platform. In the case of Tizen™, two or more API sets may be provided to each platform.

The applications 370 may include a preloaded application and/or a third party application, and may include a home 371, dialer 372, a short message service (SMS)/multimedia messaging service (MMS) 373, instant message (IM) 374, browser 375, camera 376, alarm 377, contact 378, voice dial 379, electronic mail (e-mail) 380, calendar 381, media player 382, album 383, and clock application 384, and any other suitable and/or similar application.

At least a part of the programming module 310 may be implemented by instructions stored in a non-transitory computer-readable storage medium. When the instructions are executed by one or more processors, the one or more processors may perform functions corresponding to the instructions. The non-transitory computer-readable storage medium may be the memory 230. At least a part of the programming module 310 may be executed by the one or more AP 210, and may include a module, a program, a routine, a set of instructions, and/or a process for performing one or more functions.

Figure 4:
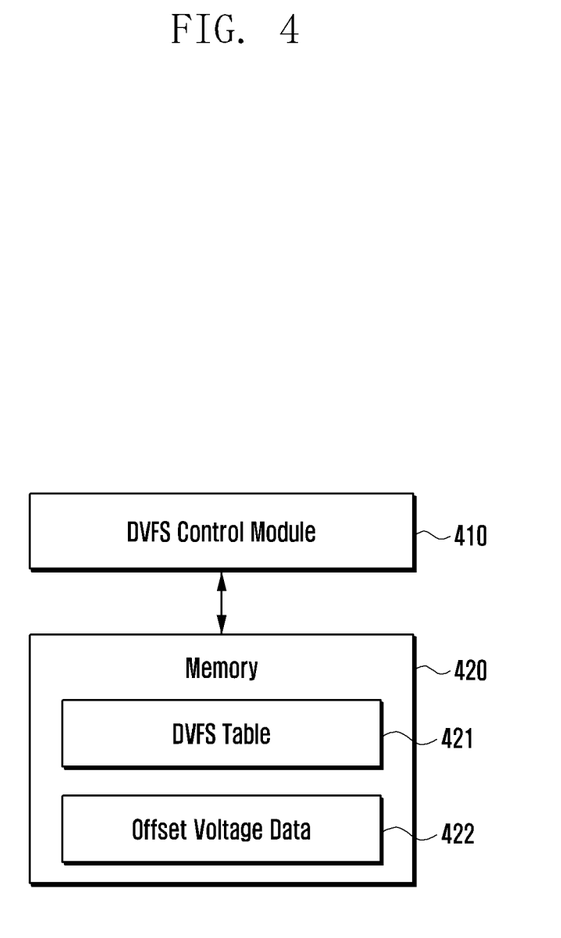
FIG. 4 illustrates a block diagram of main elements of an electronic device, according to various embodiments of the present disclosure.

FIG. 4 illustrates a block diagram of main elements of an electronic device, according to various embodiments of the present disclosure.

As exemplarily shown in FIG. 4, the electronic device 101 according to various embodiments may include a dynamic voltage and frequency scaling (DVFS) control module 410 and a memory 420. According to various embodiments, the DVFS control module 410 may be functionally connected to the memory 420 and may load at least one data from the memory 420 or control at least one data to be stored in the memory 420. According to various embodiments, the memory 420 may store a DVFS table 421 and/or offset voltage data 422.

According to various embodiments, the DVFS table 421 may be a table in which at least one condition for variably driving a processor (e.g., the processor 120) is defined, based on an operating state (e.g., load, frequency, voltage, etc.) of the electronic device 101.

According to various embodiments, with the voltage defined in the DVFS table 421 applied, the electronic device 101 may determine a threshold voltage for a normal operation. The offset voltage data 422 may be data on an offset voltage determined to apply the threshold voltage.

Although the DVFS table 421 and the offset voltage data 422 are depicted as separate blocks in FIG. 4, the DVFS table 421 may include the offset voltage data 422 in another embodiment.

According to various embodiments, the electronic device 101 may determine driving conditions (e.g., frequency or applied voltage) of the processor, based on the DVFS table 421, to perform operations or process data. According to various embodiments, the electronic device 101 may improve power consumption thereof by using the DVFS control module 410.

According to various embodiments, the DVFS control module 410 may determine whether the electronic device 101 operates normally as a default voltage is lowered, and then may acquire an offset voltage of the electronic device 101. For example, in order to drive the electronic device 101 at a specific frequency, the DVFS control module 410 may apply a specific voltage corresponding to the specific frequency and defined in the DVFS table 421. For example, with the specific voltage corresponding to the specific frequency applied, the DVFS control module 410 may apply an operating load to the electronic device 101 and lower the applied voltage on a certain condition. For example, the DVFS control module 410 may decide whether the electronic device 101 operates normally as the applied voltage is lowered, and may, based on the decision, determine a threshold value of applicable voltages for operation at the specific frequency. For example, the DVFS control module 410 may determine an offset voltage corresponding to the threshold value of voltages and also store the offset voltage in the offset voltage data 422.

According to various embodiments, the DVFS control module 410 may acquire an offset voltage of the electronic device 101 by using hardware performance monitor (HPM) information.

According to various embodiments, the HPM is a ring oscillator and may be used as a value of representing a speed characteristic of a semiconductor. The DVFS control module 410 may compare an HPM value in a condition where the module (e.g., SoC) is manufactured with an HPM value in a condition where the module is mounted in the electronic device 101. Based on this comparison, the DVFS control module 410 may eliminate a voltage margin due to a board voltage drop and a PMIC variation and then obtain an offset voltage of the electronic device 101. A detailed embodiment will be described below with reference to FIG. 6. According to various embodiments, the DVFS control module 410 may apply the threshold value of voltages to the SoC, based on the DVFS table 421 and the offset voltage data 422, and thus improve power consumption of the SoC.

Figure 5:
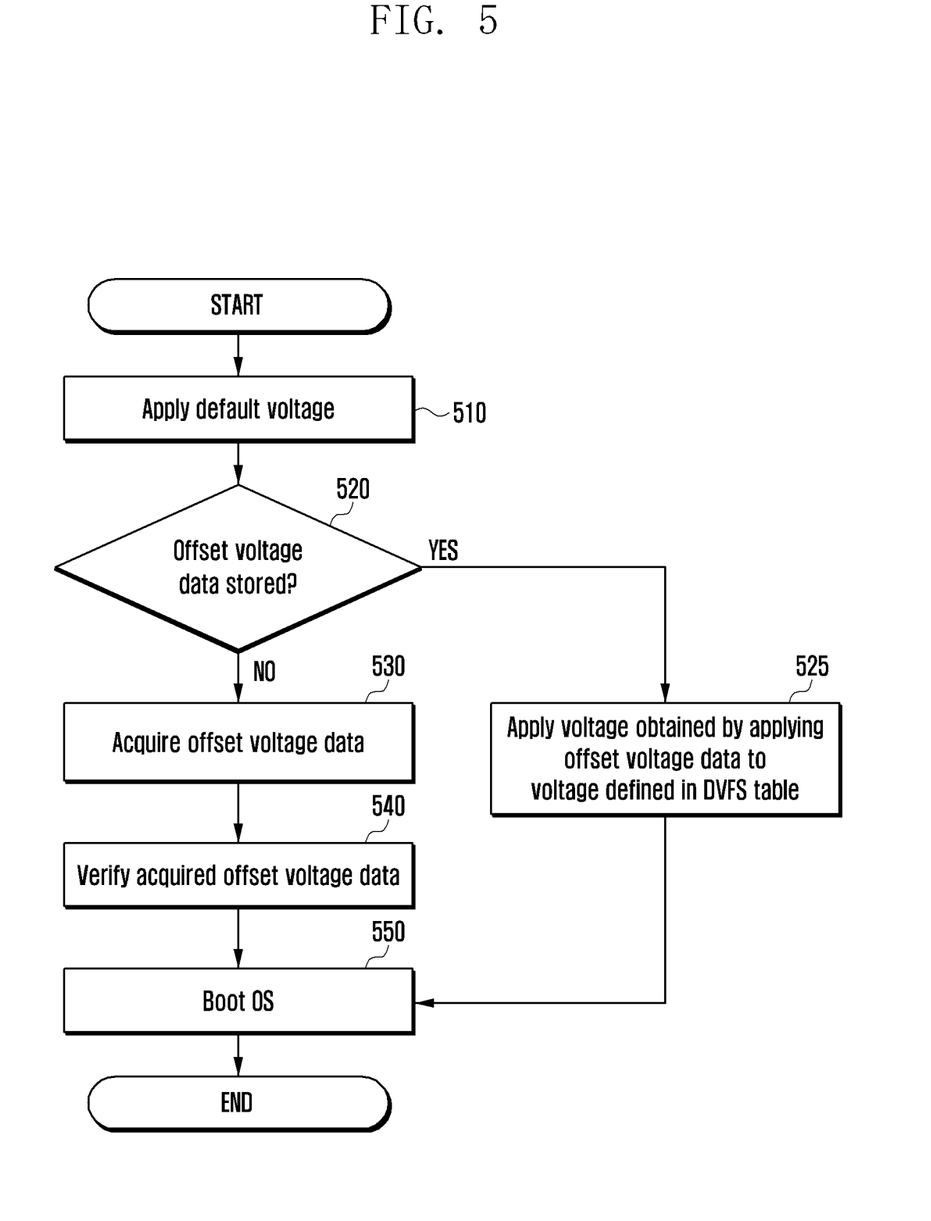
FIG. 5 illustrates a flow diagram of a method for booting an operating system (OS) depending on whether offset voltage data is stored in an electronic device, according to various embodiments of the present disclosure.

FIG. 5 illustrates a flow diagram of a method for booting an operating system (OS) depending on whether offset voltage data is stored in an electronic device, according to various embodiments of the present disclosure.

As shown in FIG. 5, according to various embodiments, the electronic device 101 may apply a predefined default voltage at operation 510 so as to drive at least one module (e.g., SoC) included in the electronic device 101 at a specific frequency.

According to various embodiments, at operation 520, the electronic device 101 may check whether the offset voltage data 422 is stored. For example, the electronic device 101 may determine whether there is an offset voltage table that records the offset voltage data 422.

According to various embodiments, when the offset voltage data 422 is stored, the electronic device 101 performs operation 525 to apply a specific voltage obtained by applying the offset voltage data 422 to a corresponding voltage defined in the DVFS table 421.

According to various embodiments, in case of preferentially considering power consumption (e.g., in a power-saving mode), the electronic device 101 may apply the lowest voltage to the SoC, based on the offset voltage data 422.

According to various embodiments, in case of preferentially considering stability (e.g., in a safety mode), the electronic device 101 may apply the default voltage defined in the DVFS table 421 to the SoC.

According to various embodiments, the electronic device 101 may define power consumption levels and supply the SoC with electric power of a specific voltage that is lowered by a certain percentage from a difference between the default voltage defined in the DVFS table 421 and a voltage stored in the offset voltage data 422. For example, in order to drive the SoC at a specific frequency (e.g., 1.8 GHz), the default voltage defined in the DVFS table 421 may be 1.35V, and a voltage of the offset voltage data 422 determined in the electronic device 101 may be 1.25V. In this case, the voltage that can be applied to the SoC by the electronic device 101 to operate at a frequency of 1.8 GHz may have a margin of 0.1V in comparison with the default voltage defined in the DVFS table. For example, depending on the power consumption levels, the electronic device 101 may determine the applied voltage of the SoC by lowering a voltage calculated at a certain rate of 0.1V (e.g., 0.08V (i.e., multiplying 0.8 by 0.1V) in a mode for securing 80% of power consumption efficiency compared to the basic operation) from the default voltage defined in the DVFS table.

According to various embodiments, if the offset voltage data 422 is not stored, the electronic device 101 may perform operation 530 to acquire the offset voltage data 422 of the electronic device 101 by checking whether the electronic device 101 is operating normally as the default voltage is lowered, or by using a hardware performance monitor (HPM). For example, the electronic device 101 may record the acquired offset voltage data 422 in the offset voltage table.

According to various embodiments, the electronic device 101 may activate a tack for applying a predetermined load while applying a voltage defined in the DVFS table 421 to operate the module (e.g., SoC) at a specific frequency. According to various embodiments, with the predetermined load applied, the electronic device 101 may lower the applied voltage to a predetermined level, and then sequentially change DVFS parameters (e.g., a central processing unit (CPU), an internal (INT) memory, a memory interface (MIF) memory, a graphics processing unit (GPU), an image signal processor (ISP), etc.). According to various embodiments, by sequentially changing the DVFS parameters in a state where the applied voltage is lowered, the electronic device 101 may monitor the operating state thereof. For example, if the electronic device 101 is operating normally until all of the DVFS parameters are changed, the electronic device 101 may store, as the offset voltage data 422, a voltage currently applied to the SoC. According to various embodiments, after the offset voltage data 422 is stored, the electronic device 101 may lower the voltage applied to the SoC by a predetermined level, and repeat this procedure. Through the repetition of this procedure, the electronic device 101 may identify the minimum voltage for allowing the SoC to operate normally and thus maximally reduce a margin of a voltage to be applied.

According to various embodiments, the electronic device 101 may find an abnormally operating case of the electronic device 101 in a process of changing the voltage applied to the SoC or in a process of sequentially changing the DVFS parameters on a constant voltage condition.

According to various embodiments, when the electronic device 101 is operating abnormally, the electronic device 101 may perform an abnormal situation recovery procedure (e.g., watchdog). For example, the electronic device 101 may initiate the procedure (e.g., remove offset voltage information in case of abnormal operation from the offset voltage table) and be restarted. In case of restart, the voltage to be applied to the SoC may be determined by applying a voltage (e.g., a normally operating offset voltage or a voltage increased or decreased by a certain rate in the offset voltage) stored in the offset voltage data 422 to a voltage (e.g., a default voltage) defined in the DVFS table 421.

According to various embodiments, the operation of acquiring the offset voltage data 422 using HPM information at the electronic device 101 will be exemplarily described with reference to FIG. 6.

According to various embodiments, at operation 540, the electronic device 101 may verify the acquired offset voltage data 422. For example, the electronic device 101 may drive the processor (e.g., the processor 120) at the maximum load state and verify that there is no problem in the operation of the electronic device 101 at the maximum load state.

According to various embodiments, at operation 550, the electronic device 101 may boot the operating system (OS) based on the offset voltage data 422.

Figure 6:
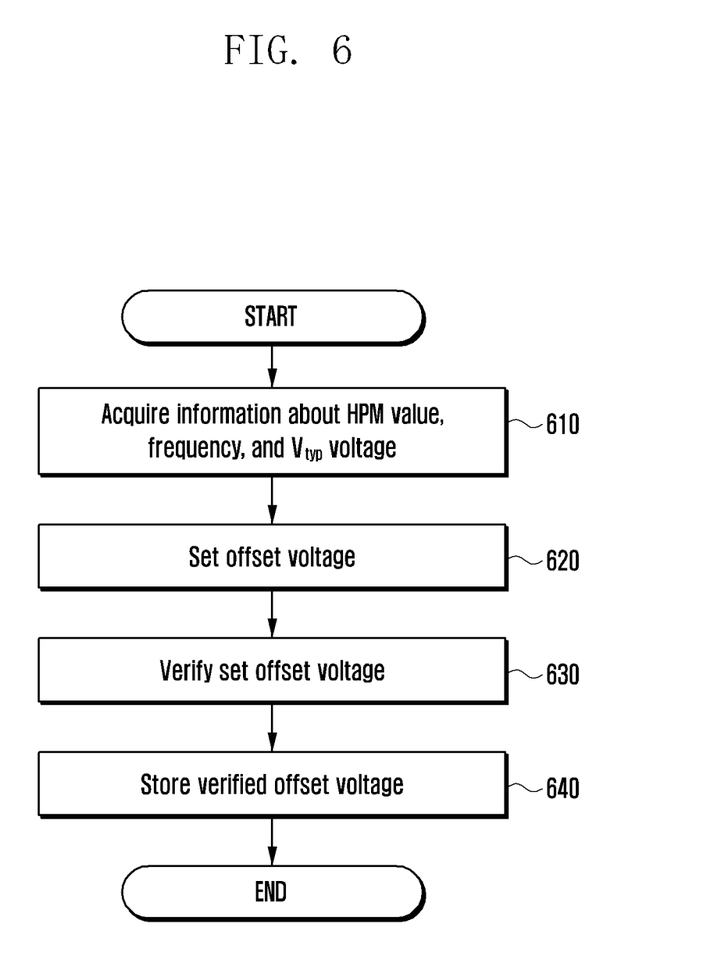
FIG. 6 illustrates a flow diagram of a method for setting, verifying and storing an offset voltage of an electronic device by using hardware performance monitor (HPM) information, according to various embodiments of the present disclosure.

FIG. 6 illustrates a flow diagram of a method for setting, verifying and storing an offset voltage of an electronic device by using hardware performance monitor (HPM) information, according to various embodiments of the present disclosure.

According to various embodiments, the HPM is a ring oscillator and may be used as a value of representing a speed characteristic of a semiconductor. The electronic device 101 may compare an HPM value in a condition where the module (e.g., SoC) is manufactured with an HPM value in a condition where the module is mounted in the electronic device 101. Based on this comparison, the electronic device 101 may eliminate a voltage margin due to a board voltage drop and a PMIC variation.

According to various embodiments, at operation 610, the electronic device 101 may acquire information about an HPM value, a frequency, and a $V_{typ}$ voltage. For example, for each DVFS parameter (e.g., CPU, INT, MIF, GPU, ISP, etc.), the electronic device 101 may acquire information about an HPM value, a frequency, and a $V_{typ}$ voltage. Here, the $V_{typ}$ voltage refers to a voltage which is set depending on the ASV group in the specification.

According to various embodiments, at operation 620, the electronic device 101 may set an offset voltage. For example, using an equation "$V_{test}=(V_{typ}-V_{typ}*0.05)-HPM$ offset", the electronic device 101 may set the offset voltage.

According to various embodiments, $V_{test}$ refers to an offset voltage to be set, and HPM offset refers to a difference between an HPM value when the chip is mounted in the electronic device 101 and an HPM value when the chip is manufacture. Here, the reason that $V_{typ}*0.05$ is subtracted from $V_{typ}$ is that $V_{typ}$ already includes an additional margin. Generally, a chip vendor adds a margin of 5% to set a $V_{typ}$ value. This value (i.e., 5%) is, however, exemplary only and may vary according to the policy of a vender which manufactures the chip.

According to various embodiments, the HPM offset may refer to a value obtained by converting the difference of the HPM value into a voltage. For example, when the CPU operates at 1.5 GHz, the HPM value at the time of chip manufacture may be 60, and the HPM value in a state where the chip is mounted in the electronic device 101 may be 70. In this case, the HPM offset is 10. Since 1 HPM generally means 0.025 V, the voltage according to the HPM offset may be 0.25 V. Thus, in this case, the voltage to be applied to drive the chip, after mounted on the board, at the same frequency may be reduced by 0.25 V. Namely, this may mean that the electronic device 101 secures an additional margin of 0.25 V in addition to the margin set by the vendor manufacturing the chip. Therefore, the electronic device 101 may set a value obtained by subtracting 0.25 V from "$V_{typ}-V_{typ}*0.05$" to the offset voltage. For reference, the voltage unit of HPM values is not fixed to 0.025 V, and the voltage unit may vary depending on the system configuration.

According to various embodiments, the electronic device 101 may consider the worst case when setting the offset voltage at operation 620. For example, the HPM value (e.g., the HPM value at the time of chip manufacture or the HPM value in a state where the chip is mounted in the electronic device 101) may not be constant. Therefore, when setting the offset voltage, the electronic device 101 may subtract a smaller value of the acquired HPM offsets (e.g., selecting 0.1 V from among 0.1 V and 0.2 V) in case of having to subtract the margin, and may add a higher value of the acquired HPM offsets (e.g., selecting −0.2 V from among −0.1 V and −0.2 V). This may alleviate the problem of performance degradation or malfunction that may result from scaling.

According to various embodiments, at operation 630, the electronic device 101 may verify the set offset voltage.

According to various embodiments, the electronic device 101 may perform a full load operation to verify the set offset voltage. For example, in order to perform the full load operation for each DVFS parameter, the electronic device 101 may perform a zip/unzip evaluation for CPU, a samurai 1080P video playback evaluation for GPU, and a memtester (octa core) vector evaluation for MIF. If any abnormal operation (e.g., lockup) occurs during this evaluation process, it may be judged that there is a defect.

According to various embodiments, at operation 640, the electronic device 101 may store the verified offset voltage. For example, the electronic device 101 may store the offset voltage which is set for each DVFS parameter and frequency.

According to various embodiments, the electronic device 101 may perform operations 610 through 640 in accordance with the start and end of a timer. For example, the electronic device 101 may set, verify and store the offset voltage for each DVFS parameter and frequency in response to the start of the timer, and then terminate the timer upon completion of verification of all offset voltages. In another example, if it is impossible to set, verify and store all the offset voltages because of a short time of the timer, the electronic device 101 may set, verify and store the offset voltage for a particular frequency and then perform interpolation for the remaining frequencies by using a voltage reduction of adjacent frequencies and a frequency difference.

Figure 7:
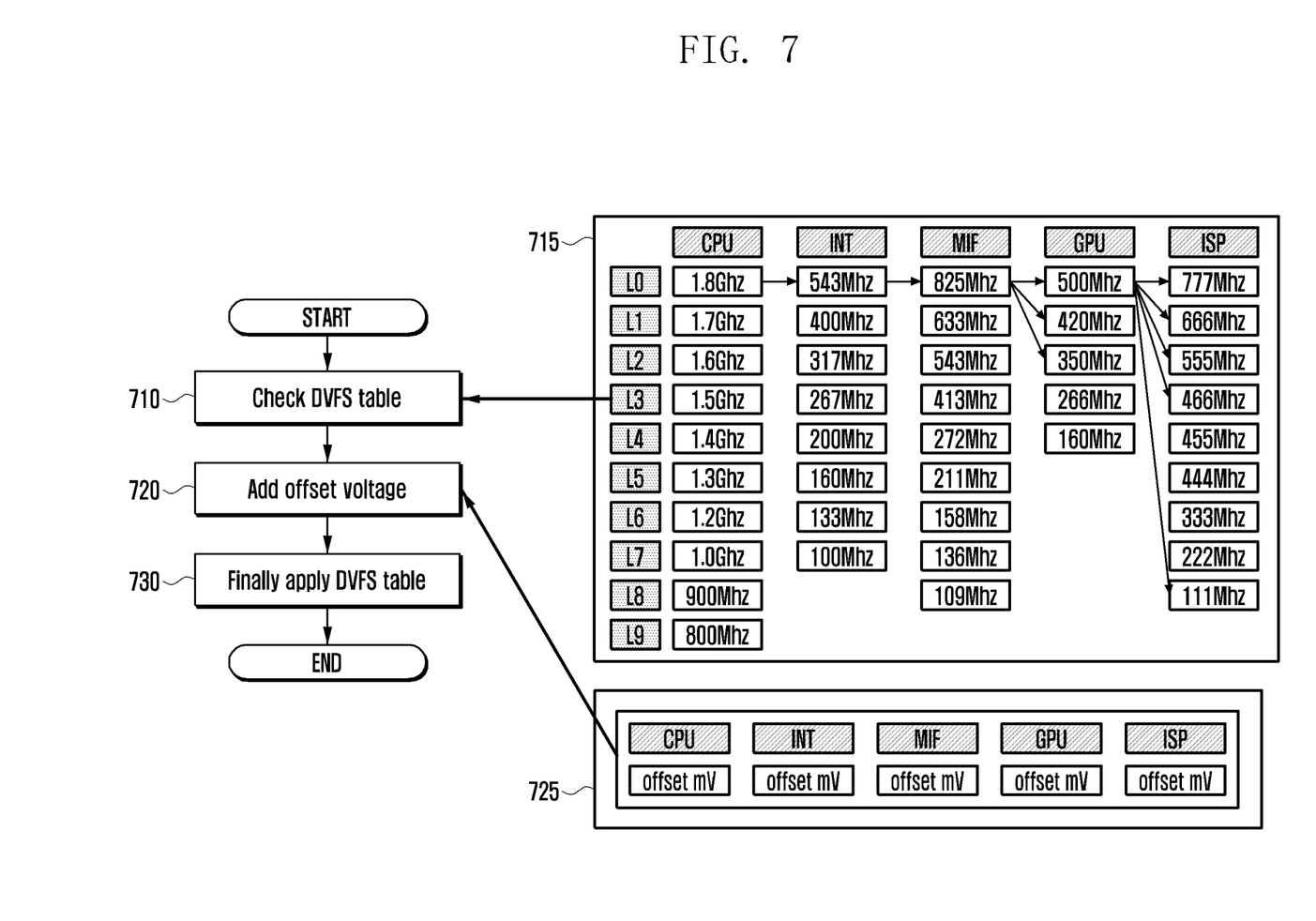
FIG. 7 illustrates a schematic diagram of a method for updating a DVFS table of an electronic device, according to various embodiments of the present disclosure.

FIG. 7 illustrates a schematic diagram of a method for updating a DVFS table of an electronic device according to various embodiments of the present disclosure.

As shown in FIG. 7, according to various embodiments, the electronic device 101 may check the DVFS table 715 at operation 710. For example, the DVFS table 715 may be divided into blocks according to DVFS parameters (e.g., CPU, INT, MIF, GPU, ISP, etc.) and corresponding frequencies. Also, the HPM value and the $V_{typ}$ value may be stored for each block.

According to various embodiments, at operation 720, the electronic device 101 may add an offset voltage. For example, the electronic device 101 may acquire information about the offset voltage by using the HPM for each block, and then may create the offset voltage table 725 based on the acquired information. Although the offset voltage table 725 is depicted as consisting of one row, the offset voltage table 725 may be organized as a table corresponding to the DVFS table 715 to include information about each offset voltage.

According to various embodiments, at operation 730, the electronic device 101 may further apply the offset voltage table 725 to the DVFS table 715. For example, the electronic device 101 may newly define a DVFS table optimized for the electronic device 101 by further applying the offset voltage table 725 to the DVFS table 715 for each ASV group. Through this, the power consumption of the electronic device 101 may be minimized by applying a suitable voltage lower than a voltage defined in the basic DVFS table according to board-specific characteristics. Additionally, a suitable voltage higher than a voltage defined in the basic DVFS table may be applied depending on the board-specific characteristics so as to fill the defective margin. Therefore, the module (e.g., SoC) which is planned to operate abnormally may be restored to operate normally.

According to various embodiments, an electronic device may comprise a system-on-chip (SoC) including at least one component; a memory; and a processor functionally connected to the SoC and the memory. The processor may be configured to apply a default voltage for driving the at least one component at a specific frequency, to determine whether data on an offset voltage corresponding to the at least one component and the specific frequency is stored, and to apply the offset voltage, being different from the default voltage, to the at least one component when the data on the offset voltage is stored.

When applying the default voltage, the processor may be further configured to load a dynamic voltage and frequency scaling (DVFS) table, and to apply the default voltage by identifying the default voltage corresponding to the at least one component and the specific frequency in the DVFS table.

The at least one component may include at least one of a central processing unit (CPU), an internal (INT) memory, a memory interface (MIF) memory, a graphics processing unit (GPU), and an image signal processor (ISP).

The processor may be further configured to acquire data on the offset voltage by using a hardware performance monitor (HPM) when the data on the offset voltage is not stored, to verify the acquired data on the offset voltage, and to store the verified data on the offset voltage in an offset voltage table.

When acquiring the data on the offset voltage, the processor may be further configured to acquire information about the default voltage and an HPM value corresponding to the at least one component and the specific frequency, and to acquire the data on the offset voltage corresponding to the default voltage and the HPM value.

When acquiring the data on the offset voltage, the processor may be further configured to acquire the data on the offset voltage from an updated default voltage obtained by decreasing the default voltage by a predetermined rate.

The predetermined rate may be a margin value which is set by a vender manufacturing the SoC.

When acquiring the data on the offset voltage, the processor may be further configured to compare the HPM value in a condition where the SoC is manufactured with the HPM value in a condition where the SoC is mounted in the electronic device, and to acquire the data on the offset voltage, at least based on a difference between the compared HPM values.

When acquiring the data on the offset voltage, the processor may be further configured to acquire the data on the offset voltage by subtracting a voltage corresponding to the difference between the compared HPM values from the updated default voltage when the HPM value in a condition where the SoC is mounted in the electronic device is greater than the HPM value in a condition where the SoC is manufactured, and to acquire the data on the offset voltage by adding a voltage corresponding to the difference between the compared HPM values to the updated default voltage when the HPM value in a condition where the SoC is mounted in the electronic device is smaller than the HPM value in a condition where the SoC is manufactured.

When applying the offset voltage to the at least one component, the processor may be further configured to identify an operating mode of the electronic device, and to apply a particular voltage to the at least one component, the particular voltage being obtained by lowering a predetermined rate of a difference between the default voltage and the offset voltage from the default voltage, based on the identified operating mode.

According to various embodiments, a method for driving an electronic device in which a system-on-chip (SoC) including at least one component is mounted may comprise operations of applying a default voltage for driving the at least one component at a specific frequency; determining whether data on an offset voltage corresponding to the at least one component and the specific frequency is stored; and applying the offset voltage, being different from the default voltage, to the at least one component when the data on the offset voltage is stored.

The operation of applying the default voltage may include operations of loading a dynamic voltage and frequency scaling (DVFS) table, and applying the default voltage by identifying the default voltage corresponding to the at least one component and the specific frequency in the DVFS table.

The at least one component may include at least one of a central processing unit (CPU), an internal (INT) memory, a memory interface (MIF) memory, a graphics processing unit (GPU), and an image signal processor (ISP).

The method may further comprise operations of acquiring data on the offset voltage by using a hardware performance monitor (HPM) when the data on the offset voltage is not stored; verifying the acquired data on the offset voltage; and storing the verified data on the offset voltage in an offset voltage table.

The operation of acquiring the data on the offset voltage may include operations of acquiring information about the default voltage and an HPM value corresponding to the at least one component and the specific frequency, and acquiring the data on the offset voltage corresponding to the default voltage and the HPM value.

The operation of acquiring the data on the offset voltage may include operation of acquiring the data on the offset voltage from an updated default voltage obtained by decreasing the default voltage by a predetermined rate.

The predetermined rate may be a margin value which is set by a vender manufacturing the SoC.

The operation of acquiring the data on the offset voltage may include operations of comparing the HPM value in a condition where the SoC is manufactured with the HPM value in a condition where the SoC is mounted in the electronic device, and acquiring the data on the offset voltage, at least based on a difference between the compared HPM values.

The operation of acquiring the data on the offset voltage may include operations of acquiring the data on the offset voltage by subtracting a voltage corresponding to the difference between the compared HPM values from the updated default voltage when the HPM value in a condition where the SoC is mounted in the electronic device is greater than the HPM value in a condition where the SoC is manufactured, and acquiring the data on the offset voltage by adding a voltage corresponding to the difference between the compared HPM values to the updated default voltage when the HPM value in a condition where the SoC is mounted in the electronic device is smaller than the HPM value in a condition where the SoC is manufactured.

The operation of applying the offset voltage to the at least one component may include operations of identifying an operating mode of the electronic device, and applying a particular voltage to the at least one component, the particular voltage being obtained by lowering a predetermined rate of a difference between the default voltage and the offset voltage from the default voltage, based on the identified operating mode.

The term "module" used in the present disclosure may refer to a unit including one or more combinations of hardware, software, and firmware. The "module" may be interchangeable with a term, such as "unit," "logic," "logical block," "component," or "circuit". The "module" may be a minimum unit of a component formed as one body or a part thereof, may be a minimum unit for performing one or more functions or a part thereof, and may be implemented mechanically or electronically. For example, the "module" according to an embodiment of the present disclosure may include at least one of an application-specific integrated circuit (ASIC) chip, a field-programmable gate array (FPGA), and a programmable-logic device for performing certain operations which have been known or are to be developed in the future.

Examples of computer-readable media include: magnetic media, such as hard disks, floppy disks, and magnetic tape; optical media such as compact disc read only memory (CD-ROM) disks and digital versatile disc (DVD), magneto-optical media, such as floptical disks, and hardware devices that are specially configured to store and perform program instructions, such as ROM, RAM, and flash memory. Examples of program instructions include machine code instructions created by assembly languages, such as a compiler, and code instructions created by a high-level programming language executable in computers using an interpreter. The described hardware devices may be configured to act as one or more software modules in order to perform the operations and methods described above, or vice versa.

Modules or programming modules according to the embodiments of the present disclosure may include one or more components, remove part of the components described above, or include new components. The operations performed by modules, programming modules, or the other components, according to the present disclosure, may be executed in serial, parallel, repetitive or heuristic fashion. Part of the operations can be executed in any other order, omitted, or executed with additional operations.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. An electronic device comprising:
   a system-on-chip (SoC) including at least one component;
   a memory; and
   a processor functionally connected to the SoC and the memory, wherein the processor is configured to:
   apply a default voltage for driving the at least one component at a specific frequency,
   determine whether data on an offset voltage corresponding to the at least one component and the specific frequency is stored in an offset voltage table,
   apply the offset voltage, being different from the default voltage, to the at least one component when the data on the offset voltage is stored,
   acquire data on the offset voltage by using a hardware performance monitor (HPM) when the data on the offset voltage is not stored, and
   update the offset voltage table based on the acquired data.

2. The electronic device of claim 1, wherein when applying the default voltage, the processor is further configured to:
   load a dynamic voltage and frequency scaling (DVFS) table, and
   apply the default voltage by identifying the default voltage corresponding to the at least one component and the specific frequency in the DVFS table.

3. The electronic device of claim 1, wherein the at least one component includes at least one of a central processing unit (CPU), an internal (INT) memory, a memory interface (MIF) memory, a graphics processing unit (GPU), and an image signal processor (ISP).

4. The electronic device of claim 1, wherein the processor is further configured to:
   verify the acquired data on the offset voltage, and
   store the verified data on the offset voltage in the offset voltage table.

5. The electronic device of claim 4, wherein when acquiring the data on the offset voltage, the processor is further configured to:
   acquire information about the default voltage and an HPM value corresponding to the at least one component and the specific frequency, and
   acquire the data on the offset voltage corresponding to the default voltage and the HPM value.

6. The electronic device of claim 5, wherein when acquiring the data on the offset voltage, the processor is further configured to:
   acquire the data on the offset voltage from an updated default voltage obtained by decreasing the default voltage by a predetermined rate.

7. The electronic device of claim 6, wherein the predetermined rate is a margin value that is set by a vender manufacturing the SoC.

8. The electronic device of claim 6, wherein when acquiring the data on the offset voltage, the processor is further configured to:

compare the HPM value in a condition where the SoC is manufactured with the HPM value in a condition where the SoC is mounted in the electronic device, and acquire the data on the offset voltage, at least based on a difference between the compared HPM values.

9. The electronic device of claim 8, wherein when acquiring the data on the offset voltage, the processor is further configured to:

acquire the data on the offset voltage by subtracting a voltage corresponding to the difference between the compared HPM values from the updated default voltage when the HPM value in a condition where the SoC is mounted in the electronic device is greater than the HPM value in a condition where the SoC is manufactured, and acquire the data on the offset voltage by adding a voltage corresponding to the difference between the compared HPM values to the updated default voltage when the HPM value in a condition where the SoC is mounted in the electronic device is smaller than the HPM value in a condition where the SoC is manufactured.

10. The electronic device of claim 1, wherein when applying the offset voltage to the at least one component, the processor is further configured to:

identify an operating mode of the electronic device, and apply a particular voltage to the at least one component, the particular voltage being obtained by lowering a predetermined rate of a difference between the default voltage and the offset voltage from the default voltage, based on the identified operating mode.

11. A method for driving an electronic device that includes a system-on-chip (SoC) and at least one component, the method comprising:

applying a default voltage for driving the at least one component at a specific frequency;

determining whether data on an offset voltage corresponding to the at least one component and the specific frequency is stored in an offset voltage table;

applying the offset voltage, being different from the default voltage, to the at least one component when the data on the offset voltage is stored;

acquiring data on the offset voltage by using a hardware performance monitor (HPM) when the data on the offset voltage is not stored; and updating the offset voltage table based on the acquired data.

12. The method of claim 11, wherein applying the default voltage comprises:

loading a dynamic voltage and frequency scaling (DVFS) table, and applying the default voltage by identifying the default voltage corresponding to the at least one component and the specific frequency in the DVFS table.

13. The method of claim 11, wherein the at least one component includes at least one of a central processing unit (CPU), an internal (INT) memory, a memory interface (MIF) memory, a graphics processing unit (GPU), and an image signal processor (ISP).

14. The method of claim 12, further comprising:

verifying the acquired data on the offset voltage; and updating the offset voltage table comprises storing the verified data on the offset voltage in the offset voltage table.

15. The method of claim 14, wherein acquiring the data on the offset voltage comprises:

acquiring information about the default voltage and an HPM value corresponding to the at least one component and the specific frequency, and acquiring the data on the offset voltage corresponding to the default voltage and the HPM value.

16. The method of claim 15, wherein acquiring the data on the offset voltage comprises:

acquiring the data on the offset voltage from an updated default voltage obtained by decreasing the default voltage by a predetermined rate.

17. The method of claim 16, wherein the predetermined rate is a margin value is set by a vender manufacturing the SoC.

18. The method of claim 16, wherein acquiring the data on the offset voltage comprises:

comparing the HPM value in a condition where the SoC is manufactured with the HPM value in a condition where the SoC is mounted in the electronic device, and acquiring the data on the offset voltage, at least based on a difference between the compared HPM values.

19. The method of claim 18, further comprising:

acquiring the data on the offset voltage by subtracting a voltage corresponding to the difference between the compared HPM values from the updated default voltage when the HPM value in a condition where the SoC is mounted in the electronic device is greater than the HPM value in a condition where the SoC is manufactured, and acquiring the data on the offset voltage by adding a voltage corresponding to the difference between the compared HPM values to the updated default voltage when the HPM value in a condition where the SoC is mounted in the electronic device is smaller than the HPM value in a condition where the SoC is manufactured.

20. The method of claim 11, wherein applying the offset voltage to the at least one component comprises:

identifying an operating mode of the electronic device, and applying a particular voltage to the at least one component, the particular voltage being obtained by lowering a predetermined rate of a difference between the default voltage and the offset voltage from the default voltage, based on the identified operating mode.

* * * * *